(12) United States Patent
Youn

(10) Patent No.: US 8,618,596 B2
(45) Date of Patent: Dec. 31, 2013

(54) SEMICONDUCTOR MEMORY DEVICE AND METHOD OF FABRICATING THE SAME

(75) Inventor: Tae Un Youn, Chungcheongbuk-do (KR)

(73) Assignee: SK hynix Inc., Icheon-Si (KR)

( * ) Notice: Subject to any disclaimer, the term of this patent is extended or adjusted under 35 U.S.C. 154(b) by 847 days.

(21) Appl. No.: 12/406,821

(22) Filed: Mar. 18, 2009

(65) Prior Publication Data

US 2010/0025741 A1 Feb. 4, 2010

(30) Foreign Application Priority Data

Aug. 1, 2008 (KR) .................. 10-2008-0075749

(51) Int. Cl.
*H01L 29/788* (2006.01)

(52) U.S. Cl.
USPC .............. 257/315; 257/314; 257/E29.3

(58) Field of Classification Search
USPC .......... 257/314, 316, E29.3, 315, 317–324, 257/E29.129, E21.179, E21.422, E21.68, 257/E21.687, E21.688
See application file for complete search history.

(56) References Cited

U.S. PATENT DOCUMENTS

| | | | | |
|---|---|---|---|---|
| 5,949,101 A * | 9/1999 | Aritome | ............... | 257/315 |
| 6,380,583 B1 * | 4/2002 | Hsieh et al. | ............... | 257/314 |
| 6,465,837 B1 * | 10/2002 | Wu | ............... | 257/315 |
| 6,573,132 B1 * | 6/2003 | Uehara et al. | ............... | 438/211 |
| 7,060,559 B2 * | 6/2006 | Ozawa et al. | ............... | 438/257 |
| 2005/0258463 A1 * | 11/2005 | Yaegashi et al. | ............... | 257/296 |
| 2007/0102752 A1 * | 5/2007 | Kim | ............... | 257/316 |
| 2008/0132016 A1 | 6/2008 | Lee | | |
| 2008/0296656 A1 * | 12/2008 | Ozawa | ............... | 257/321 |

FOREIGN PATENT DOCUMENTS

| | | |
|---|---|---|
| KR | 10-1997-0053370 | 7/1997 |
| KR | 10200000444950 A | 7/2000 |
| KR | 10-2004-0087457 | 10/2004 |
| KR | 100489588 B1 | 5/2005 |
| KR | 10-2008-0012060 | 2/2008 |
| KR | 10-0824157 | 4/2008 |

\* cited by examiner

*Primary Examiner* — Cuong Q Nguyen
*Assistant Examiner* — Yosef Gebreyesus
(74) *Attorney, Agent, or Firm* — Marshall, Gerstein & Borun LLP

(57) ABSTRACT

The present invention discloses a method of fabricating a semiconductor memory device including forming sequentially a gate insulating layer and a first conductive pattern on a semiconductor substrate; forming a protective layer on surfaces of the first conductive pattern and the gate insulating layer; performing an etching process to form a trench, the etching process being performed such that the protective layer remains on side walls of the first conductive pattern to form a protective pattern; forming an isolation layer in the trench; etching the isolation layer; removing the protective pattern above a surface of the isolation layer; and forming sequentially a dielectric layer and a second conductive layer on surfaces of the isolation layer, the protective pattern and the first conductive pattern.

3 Claims, 3 Drawing Sheets

SEMICONDUCTOR MEMORY DEVICE AND METHOD OF FABRICATING THE SAME

CROSS-REFERENCE TO RELATED APPLICATIONS

Priority to Korean Patent Application No. 10-2008-0075749, filed on Aug. 1, 2008, the disclosure of which is incorporated by reference in its entirety, is claimed.

BACKGROUND OF THE INVENTION

The present invention relates generally to a semiconductor memory device and a method of fabricating the same, and more particularly relates to a semiconductor memory device capable of inhibiting generation of etching damage caused during a process of fabricating a semiconductor memory device, and a method of fabricating the same.

In semiconductor memory devices, a flash memory device comprises a plurality of strings. In each string, memory cells are disposed in serial. The string is formed on an active region, and an isolation layer is formed between the strings so that the strings are electrically isolated from each other.

A method for fabricating a flash memory device is illustrated in detail as follows.

On a semiconductor substrate, a gate insulating layer, a first conductive layer to be used for forming a floating gate, a dielectric layer, a second conductive layer to be used for forming a control gate and a gate mask pattern are sequentially formed. An etching process is performed according to the gate mask pattern to form an isolation trench on the semiconductor substrate. In particular, in the etching process performed for forming the trench, side walls of the first conductive layer and the gate insulating layer are exposed so that an etching damage can be generated.

In addition, after the trench is formed, an oxidation process can be performed for compensating for etching damage in the trench. At this time, a "bird's beak" phenomenon, in which the thickness of both ends of the exposed gate insulating layer is increased, can be generated.

SUMMARY OF THE INVENTION

In the present invention, when a process for forming an isolation trench is performed, a first conductive layer to be used for forming a floating gate is patterned to form a first conductive pattern, a protective layer is then formed along surfaces of the first conductive pattern and an exposed gate insulating layer, and therefore the side walls of the first conductive layer can be protected by the protective layer during the subsequent etching process. In addition, since the gate insulating layer is formed such that a width of the gate insulating pattern is wider than that of the first conductive pattern, it is possible to compensate a defect caused by an excessive oxidation generated at both ends of the gate insulating layer during the subsequent etching process.

A method of fabricating a semiconductor memory device according to an embodiment includes: sequentially forming a gate insulating layer and a first conductive pattern on a semiconductor substrate; forming a protective layer along surfaces of the first conductive pattern and the gate insulating layer; performing an etching process to form a trench; the etching process being performed such that the protective layer remains on side walls of the first conductive pattern to form a protective pattern; forming an isolation layer in the trench; etching the isolation layer; removing the protective pattern above a surface of the isolation layer; and forming sequentially a dielectric layer and a second conductive layer along surfaces of the isolation layer, the protective pattern and the first conductive pattern.

Sequentially forming the gate insulating layer and the first conductive pattern on the semiconductor substrate can include forming a gate insulating layer on the semiconductor substrate; forming a first conductive layer on the gate insulating layer; and patterning the first conductive layer to form the first conductive pattern on the gate insulating layer.

The first conductive layer is preferably formed by laminating sequentially an undoped polysilicon layer and a doped polysilicon layer. The second conductive layer is preferably formed of a doped polysilicon layer.

The protective layer preferably is formed of a nitride layer, which can be formed through a deposition process or a nitrification process. For example, the protective layer preferably has a thickness in a range of about 50 Å to about 100 Å.

The method of fabricating a semiconductor memory device can further include performing an oxidation process to compensate for damage to a surface of the trench after the trench is formed.

Etching the isolation layer is preferably performed through an etching process so as to prevent the gate insulating layer from being exposed.

Removing the protective pattern above a surface of the isolation layer is preferably performed by a dry etching process or a wet etching process. For example, the wet etching process can be performed by utilizing phosphoric acid ($H_3PO_4$) solution as the etchant.

A semiconductor memory device according to an embodiment includes a semiconductor substrate on which an active area and a trench are formed; a gate insulating pattern formed on the active area; a first conductive pattern formed on the gate insulating pattern and having a width narrower than that of the gate insulating pattern; protective patterns formed at lower ends of both side walls of the first conductive pattern to allow upper ends of both side walls of the first conductive pattern to be exposed; and an isolation layer formed in the trench.

Preferably, the sum of a width of the first conductive pattern and widths of the protective patterns formed at lower ends of the side walls of the first conductive pattern is the same as a width of the gate insulating pattern.

Also, a central portion of an upper portion of the isolation layer is located below an edge portion of an upper portion of the isolation layer.

The semiconductor memory device further preferably includes a dielectric layer formed along surfaces of the isolation layer, the protective pattern and the first conductive pattern; and a second conductive layer formed on the dielectric layer.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings. However, it should be understood that the embodiment of the present invention can be variously modified, the scope of the present invention is not limited to the embodiment described herein, and the embodiment is provided for explaining more completely the present invention to those skilled in the art.

FIG. 1A to FIG. 1I are sectional views for illustrating a semiconductor memory device according to an embodiment of the present invention and a method of fabricating the same.

Figure 1A:
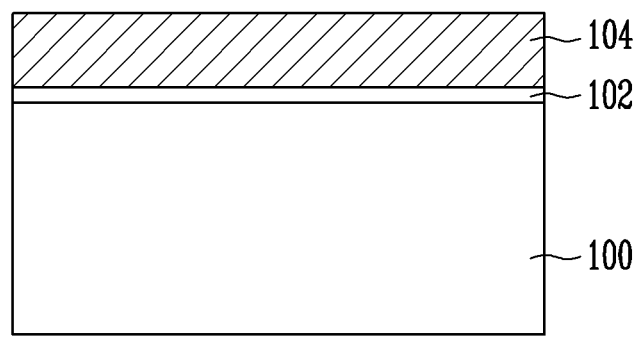
FIG. 1A to FIG. 1I are sectional views for illustrating a semiconductor memory device according to an embodiment of the present invention and a method of fabricating the same.

Referring to FIG. 1A, a gate insulating layer 102 and a first conductive layer 104 to be used for forming a floating gate are formed on a semiconductor substrate 100. The gate insulating layer 102 can be formed of an oxide layer. The first conductive layer 104 can be formed of a polysilicon layer. For example, the first conductive layer 104 can be formed of a doped polysilicon layer or can be formed by laminating sequentially an undoped polysilicon layer and a doped polysilicon layer.

Figure 1B:
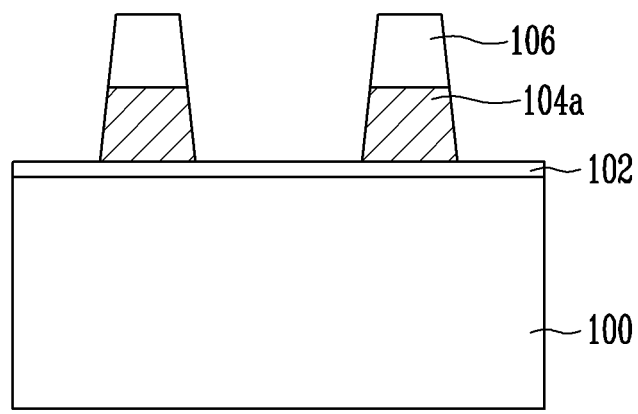

Referring to FIG. 1B, gate mask patterns 106 are formed on the first conductive layer 104. The gate mask patterns 106 can be formed according to an isolation trench pattern. Subsequently, the exposed first conductive layer (104 in FIG. 1A) can be patterned according to the gate mask patterns 106 to form first conductive patterns 104a. Preferably the gate insulating layer 102 is not patterned at this point in the method.

Hereinafter, only one gate mask pattern and only one conductive pattern are described as the example.

Figure 1C:
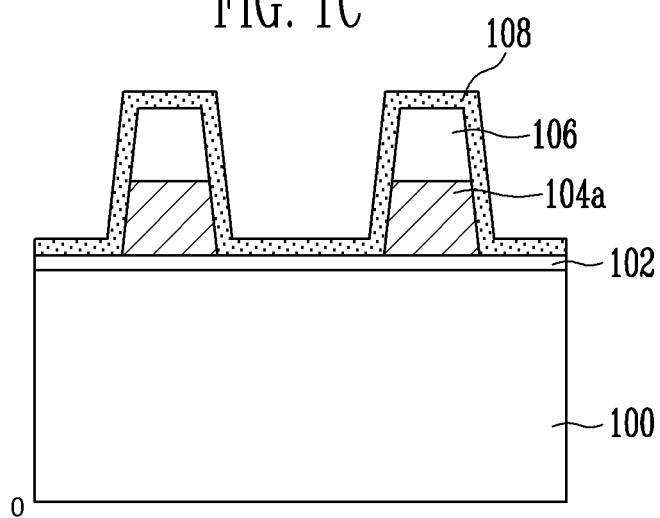

Referring to FIG. 1C, a protective layer 108 is formed along a surface of the exposed conductive pattern 104a. For example, the protective layer 108 can be formed on a surface of the exposed first conductive pattern 104a, a surface of the gate insulating layer 102 and a surface of the gate mask pattern 106.

To form the protective layer 108, a nitride layer can be formed on the exposed gate insulating layer 102, the conductive pattern 104a and the gate mask pattern 106 by performing a deposition process, or the surfaces of the exposed layer and patterns can be nitrified by performing a nitrification process. Preferably the protective layer 108 is formed of a nitride layer obtained by performing the deposition process. In other words, the protective layer 108 should preferably protect a side wall of the first conductive pattern 104a during a subsequent etching process, and so it is preferable to form the nitride layer as the protective layer 108. The thickness of the protective layer 108 may be adjusted according to a dimension of the flash memory device. For example, in the flash memory device having a critical dimension of 48 nanometers, the protective layer 108 can have a thickness of 50 Å to 100 Å.

Figure 1D:
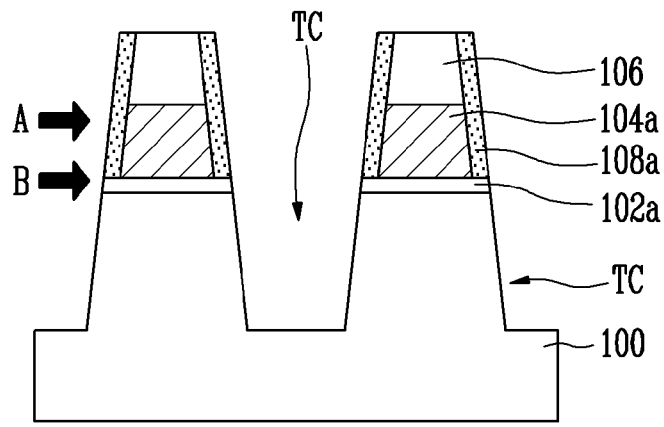

Referring to FIG. 1D, an etching process is performed for forming a trench TC on the semiconductor substrate 100. A blanket etching process or an etch back process can be performed as the etching process. Due to the etching process, the protective layer (108 in FIG. 1C) formed on the gate mask pattern 106 and the gate insulating layer (102 in FIG. 1C) is partially removed. The protective layer (108 in FIG. 1C) formed on side walls of the gate mask pattern 106 and the first conductive pattern 104a remains and acts as a protective pattern 108a. Therefore, the side walls of the first conductive pattern 104a are not exposed.

If the etching process is further performed using the protective pattern 108a, the exposed gate insulating layer (102 in FIG. 1C) is patterned to form gate insulating patterns 102a, and a portion of the semiconductor substrate 100 is etched to form a part of trench TC. Preferably, the sum of a width the first conductive pattern 104a and widths of the protective patterns 108a formed on the side walls of the first conductive pattern 104a are about the same as a width of the gate insulating pattern 102a, e.g., the same in the region of the junction of the gate insulating pattern 102a with the first conductive pattern 104a and the protective patterns 108a, at the lower ends of the protective pattern 108a. In addition, during the etching process, the exposed gate mask pattern 106 is etched partially so that a thickness thereof can be reduced.

In particular, when the etching process for forming the trench TC is performed, the side wall A of the first conductive pattern 104a is protected by the protective pattern 108a, minimizing or preventing damage caused by the etching process. After the trench TC is formed, to compensate for potential damage to a surface of the semiconductor substrate 100 exposed in the trench TC, an oxidation process can be carried out. As a result, a bird's beak phenomenon, in which a thickness of the side wall B of the gate insulating pattern 102a exposed in the trench TC is increased, can occur. However, because a width of the gate insulating pattern 102a is larger than that of the first conductive pattern 104 by a thickness of the protective pattern 108a, despite the occurrence of the bird's beak phenomenon, it is possible to prevent or reduce an electrical property from being deteriorated. In other words, in a case where the bird's beak phenomenon has occurred, because the bird's beak is mostly generated at a region on which the first conductive pattern 104a is not formed, it is possible to prevent electrical property deterioration between the gate insulating pattern 102a and the first conductive pattern 104a.

Figure 1E:
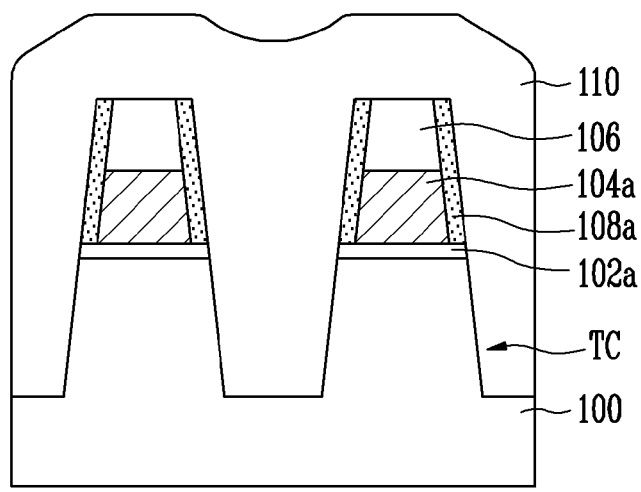

Referring to FIG. 1E, the trench TC is preferably filled with a gap-fill insulating layer 110. The gap-fill insulating layer 110 can be formed on the semiconductor substrate 100 to fill the trench TC with the gap-fill insulating layer. It is preferable to form the gap-fill insulating layer 110 sufficiently so as to cover the gate insulating pattern 106 completely with the gap-fill insulating layer 110. The gap-fill insulating layer 110 is preferably formed of an oxide layer. For example, the gap-fill insulating layer can be formed of a SOD layer (spin on dielectric layer) or a HDP layer (high density plasma layer), or by laminating a SOD layer and a HDP layer.

Figure 1F:
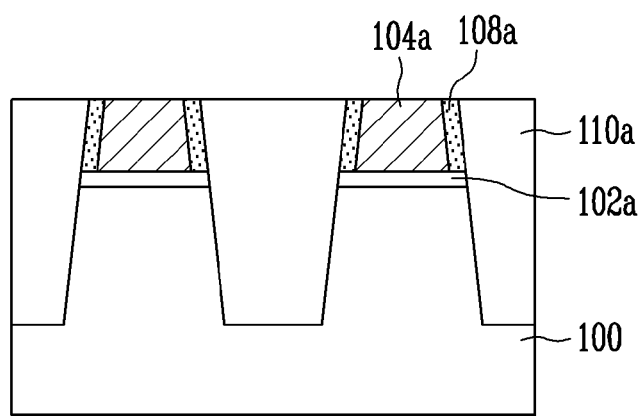

Referring to FIG. 1F, a planarization process is preferably performed to allow the first conductive pattern 104a to be exposed. For example, a chemical mechanical polishing (CMP) process can be performed as the planarization process. By performing the planarization process, the gap-fill insulating layer (110 in FIG. 1E) remains only in the trench TC, and the gap-fill insulating layer 110 remaining in the trench becomes an isolation layer 110a.

Figure 1G:
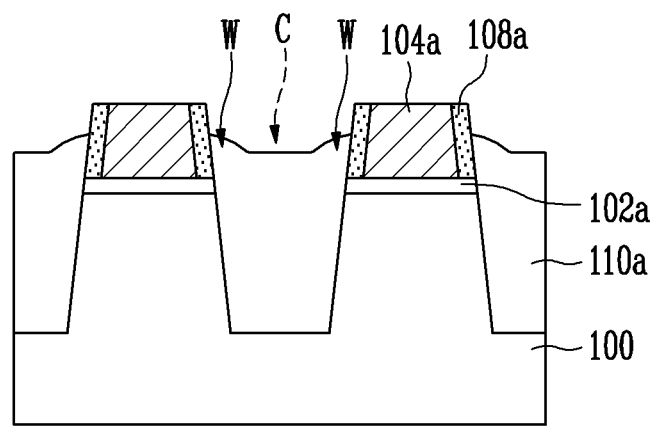

Referring to FIG. 1G, a height of the isolation layer 110a is preferably reduced to adjust the EFH (effective field height). In addition, the etching process can be further performed to allow a central portion C of an upper portion of the isolation layer 110a to become lower than an edge portion, and so wings W can be formed at both edges of the upper portion of the isolation layer 110a. If the wings W are formed at both edges of the upper portion of the isolation layer 110a, it is possible to increase a coupling ratio between the floating gate and the control gate.

Figure 1H:
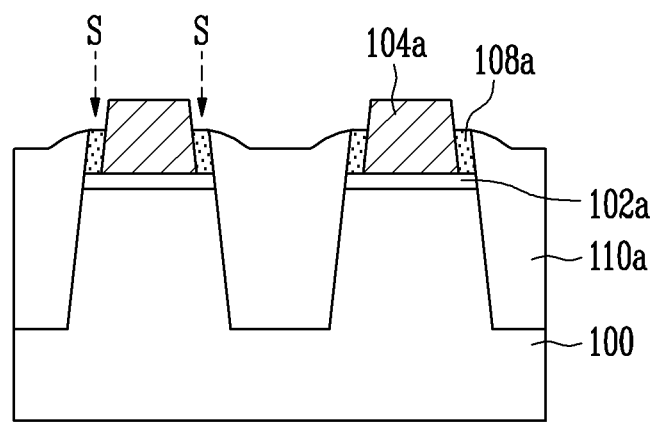

Referring to FIG. 1H, the portion of the protective pattern of 108a formed on the side walls of the first conductive pattern 104a above a surface of the isolation layer 110a is removed, preferably by an etching process. A dry etching process or a wet etching process can be performed as the etching process for removing a portion of the protective pattern. Preferably, the wet etching process is performed as the etching process. If the wet etching process is performed, an etchant whose etching ratio to the protective pattern 108a is higher than that to the first conductive pattern 104a and the isolation layer 110a is utilized. For example, phosphoric acid ($H_3PO_4$) solution can be utilized as the etchant in the wet etching process. As a result, the protective layer 108a above a surface of the isolation layer 110a is removed to expose upper portions S of the side walls of the first conductive pattern 104a.

Figure 1I:
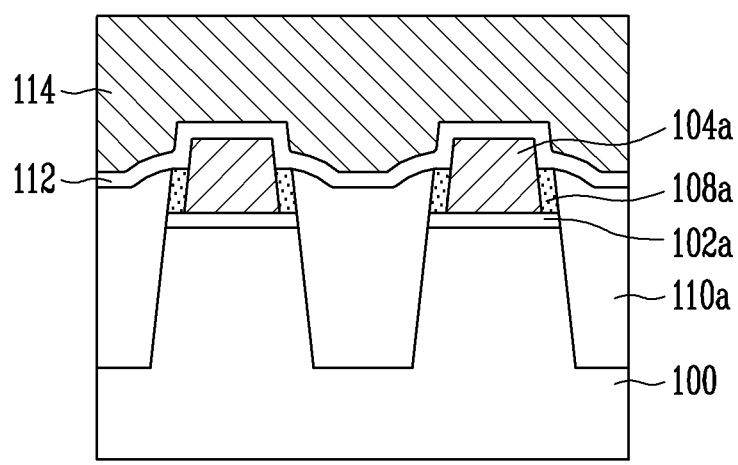

Referring to FIG. 1I, a dielectric layer 112 is preferably formed on surfaces of the isolation layer 110a, the protective layer 108a and the first conductive pattern 104a. The dielectric layer 112 can be formed by laminating an oxide layer, a nitride layer and an oxide layer. Subsequently, a second conductive layer 114 can be formed on the dielectric layer 112, for example, for forming a control gate. The second conductive layer 114 can be formed of a polysilicon layer. For example, the second conductive layer can be formed of a doped polysilicon layer.

As described above, due to the protective pattern 108a, side walls of the first conductive pattern 104a can be protected in an etching process, which is one of the processes for forming a flash memory device. In addition, the deterioration of electrical property caused by a bird's beak generated on the gate insulating pattern 102a can be inhibited by the protective pattern.

By forming a protective layer along surfaces of a first conductive pattern and an exposed gate insulating layer, it is possible to protect side walls of a first conductive pattern during a subsequent etching process. In addition, since the gate insulating layer is preferably formed such that a width of the gate insulating pattern is larger than that of the first conductive pattern, it is possible to compensate for a defect caused by the excessive oxidation at both ends of the gate insulating layer generated during the subsequent oxidation process. As a result, deterioration of the electrical property of the semiconductor memory device can be prevented or reduced, improving reliability of the semiconductor memory device.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor memory device, comprising
a semiconductor substrate having a plurality of trenches;
gate insulating patterns formed on the semiconductor substrate between the plurality of trenches;
floating gates having side walls formed on the gate insulating patterns, wherein a width of the floating gates is narrower than a width of the gate insulating patterns;
a nitride layer formed on the side walls of the floating gates, wherein a height of the nitride layer is lower than a height of the floating gates;
isolation layers formed in the plurality of trenches, wherein a height of an edge of the isolation layers is the same as a height of the nitride layer;
a dielectric layer formed on a surface of the nitride layer, the isolation layers, and the floating gates; and
a control gate formed on the dielectric layer.

2. The semiconductor memory device of claim 1, wherein the floating gates are configured such that the sum of the width of the floating gates and a width of the nitride layer is the same as the width of the gate insulating patterns.

3. The semiconductor memory device of claim 1, wherein a central portion of an upper portion of the isolation layers formed in the trenches is located below an edge portion of an upper portion of the isolation layers formed in the trenches.

\* \* \* \* \*